United States Patent
Tae et al.

(10) Patent No.: US 9,025,096 B2
(45) Date of Patent: May 5, 2015

(54) LIQUID CRYSTAL DISPLAY DEVICE AND METHOD OF FABRICATION FOR THE SAME

(75) Inventors: Seung-Gyu Tae, Yongin (KR); Deok-Hoi Kim, Yongin (KR); Chung Yi, Yongin (KR)

(73) Assignee: Samsung Display Co., Ltd. (KR)

( * ) Notice: Subject to any disclaimer, the term of this patent is extended or adjusted under 35 U.S.C. 154(b) by 302 days.

(21) Appl. No.: 12/833,807

(22) Filed: Jul. 9, 2010

(65) Prior Publication Data

US 2011/0122330 A1    May 26, 2011

(30) Foreign Application Priority Data

Nov. 23, 2009   (KR) .................. 10-2009-0113587
Nov. 23, 2009   (KR) .................. 10-2009-0113589
Mar. 30, 2010   (KR) .................. 10-2010-0028545

(51) Int. Cl.
*G02F 1/1343*   (2006.01)
*G02F 1/1362*   (2006.01)
*G02F 1/1337*   (2006.01)
*G02F 1/139*    (2006.01)

(52) U.S. Cl.
CPC .... *G02F 1/136213* (2013.01); *G02F 1/133703* (2013.01); *G02F 1/1393* (2013.01); *G02F 2001/133792* (2013.01)

(58) Field of Classification Search
USPC ...................................... 349/38–39
See application file for complete search history.

(56) References Cited

U.S. PATENT DOCUMENTS

| | | | | |
|---|---|---|---|---|
| 5,737,049 A | * | 4/1998 | Shin et al. ............. | 349/122 |
| 5,859,683 A | * | 1/1999 | Tagusa et al. .......... | 349/138 |
| 5,905,548 A | * | 5/1999 | Shimada .............. | 349/38 |
| 5,923,390 A | | 7/1999 | Jung Mok et al. | |
| 6,128,060 A | | 10/2000 | Shimada et al. | |
| 6,597,415 B2 | * | 7/2003 | Rho et al. ............. | 349/42 |
| 6,676,857 B2 | * | 1/2004 | Heeney et al. .......... | 252/500 |
| 2001/0007779 A1 | | 7/2001 | Lee et al. | |
| 2001/0019374 A1 | * | 9/2001 | Izumi et al. ........... | 349/43 |
| 2003/0007107 A1 | * | 1/2003 | Chae et al. ............ | 349/43 |
| 2003/0038241 A1 | | 2/2003 | Choo et al. | |
| 2005/0190312 A1 | | 9/2005 | Yang | |
| 2005/0263769 A1 | | 12/2005 | Chul Ahn | |

(Continued)

FOREIGN PATENT DOCUMENTS

JP   05-273592    10/1993
JP   2001-312222  11/2001

(Continued)

OTHER PUBLICATIONS

Korean Office Action dated Jun. 27, 2011 in Korean Priority Application No. 10-2010-0028545.

(Continued)

*Primary Examiner* — Hoan C Nguyen
(74) *Attorney, Agent, or Firm* — Knobbe Martens Olson & Bear LLP (57) ABSTRACT

A liquid crystal display device is disclosed. The device includes: a first substrate, a thin film transistor formed in a first, non-transmissive region on the first substrate, including a gate electrode, a source electrode and a drain electrode, and a storage capacitor formed in a second, transmissive region on the first substrate, where a first electrode and a second electrode of the storage capacitor are made of a transparent conductive material.

13 Claims, 10 Drawing Sheets

(56) References Cited

U.S. PATENT DOCUMENTS

| | | |
|---|---|---|
| 2009/0109392 A1 | 4/2009 | Hsieh et al. |
| 2009/0256980 A1 | 10/2009 | Takeda et al. |
| 2009/0262270 A1 | 10/2009 | Kim et al. |
| 2009/0284700 A1 | 11/2009 | Kim et al. |
| 2010/0283952 A1 | 11/2010 | Hashimoto et al. |
| 2011/0024753 A1* | 2/2011 | Liou .............................. 257/59 |

FOREIGN PATENT DOCUMENTS

| | | |
|---|---|---|
| JP | 10-333178 | 1/2002 |
| JP | 2005-338855 | 12/2005 |
| KR | 10-0124976 | 1/1997 |
| KR | 1999-003712 | 1/1999 |
| KR | 2001-0063293 | 7/2001 |
| KR | 20010063293 | 7/2001 |
| KR | 2001-0085344 | 9/2001 |
| KR | 10-2002-0072457 | 9/2002 |
| KR | 20020072457 | 9/2002 |
| KR | 10-2009-0119059 | 11/2009 |
| KR | 20090119059 | 11/2009 |
| WO | 2005/121884 | 12/2005 |
| WO | 2009/037835 | 3/2009 |

OTHER PUBLICATIONS

Search Report dated Dec. 20, 2010 in corresponding European Application No. 10251593.9.
Office Action dated Feb. 28, 2012 in Korean Priority Patent Application No. 10-2010-0028545.
Office Action dated Sep. 28, 2012 in Korean Priority Patent Application No. 10-2010-0028545.
Office Action dated Jul. 24, 2012 in corresponding Japanese Patent Application No. 2010-141711.
Office Action dated Jun. 20, 2013 in Korean Priority Application No. 10-2010-0028545.
Office Action dated Jan. 22, 2013 in corresponding Japanese Patent Application No. 2010-141711.
Office Action dated Dec. 23, 2014 in corresponding European Patent Application No. 10251593.9 claiming priority to Korean Patent Application No. 10-2009-0113589, 10-2009-0113587 and 10-2010-0028545.

* cited by examiner

LIQUID CRYSTAL DISPLAY DEVICE AND METHOD OF FABRICATION FOR THE SAME

CROSS-REFERENCE TO RELATED APPLICATIONS

This application claims priority to and the benefit of Korean Patent Application No. 10-2009-0113587, filed on Nov. 23, 2009, Korean Patent Application No. 10-2009-0113589, filed on Nov. 23, 2009, and Korean Patent Application No. 10-2010-0028545, filed on Mar. 30, 2010, in the Korean Intellectual Property Office, and the entire content of each of these applications is incorporated herein by reference.

BACKGROUND

1. Field

Embodiments of the present invention relate to a liquid crystal display device and a fabrication method of the same, and more specifically, embodiments of the present invention relate to a medium and small-sized liquid crystal display device to display images, having a size smaller than a typical laptop computer, and a fabrication method of the medium and small-sized liquid crystal display device.

2. Description of the Related Technology

A liquid crystal display device controls light transmittance of a liquid crystal by using an electric field, thereby displaying images. The liquid crystal display device controls a field between a pixel electrode and a common electrode, which are disposed facing each other, one on a lower substrate on which a thin film transistor is formed and the other on an upper substrate on which a color filter is formed, thereby driving the liquid crystal.

In general, a liquid crystal display device includes a lower substrate and an upper substrate, which are bonded to one another, and face each other, a spacer to uniformly maintain a cell gap between the lower substrate and the upper substrate, and a liquid crystal filled in the cell gap.

The upper substrate is generally configured to include a color filter to implement colors, a black matrix to prevent light leakage, a common electrode to control an electric field, and an alignment layer coated to align the liquid crystal. The lower substrate is generally configured to include a plurality of signal wires and a thin film transistor, a pixel electrode connected to the thin film transistor, and an alignment layer coated to align the liquid crystal. In addition, the lower substrate includes a storage capacitor to stably maintain a pixel voltage in the pixel electrode.

The storage capacitor is typically formed by forming a lower electrode and an upper electrode, and an insulating layer therebetween. The storage capacitor is generally required to have a large capacitance, in order to be applied to a high resolution display while maintaining the pixel voltage signal stable. However, in order to increase the capacitance of the storage capacitor, the area of overlap between the upper and lower electrodes of the storage capacitor generally needs to be widened. The area occupied by the upper and lower electrodes contributes to degrading the aperture ratio.

Among the operation modes of liquid crystal display devices, the PVA (Patterned Vertical Alignment) mode can improve the viewing angle of the liquid crystal display devices by arranging the liquid crystal particles in different directions to form a liquid crystal domain, using a patterned transparent electrode. This necessitates a process for forming the patterned transparent electrode to manufacture a liquid crystal display device operable in the PVA mode.

Another way to implement the PVA mode is by forming protrusions on an opposite substrate, and a common electrode on the substrate with the protrusions, to form a liquid crystal domain. In such devices an independent process of forming the protrusions is necessitated.

The process of patterning the transparent electrode and/or the process of forming protrusions while forming the liquid crystal domain of a liquid crystal display device increase the number of manufacturing processes. Further, misalignment between the display substrate and the opposite substrate during assembly contributes to misalignment of the patterns of the pixel electrodes of the display substrate and the common electrodes of the opposite substrate, thereby complicating the formation of the liquid crystal domain. Patterning the transparent electrode and forming the protrusions also decrease the aperture ratio of the liquid crystal display device.

SUMMARY OF CERTAIN INVENTIVE ASPECTS

Embodiments of the invention help to provide a medium and small sized liquid crystal display device with improved aperture ratio and electrostatic capacity.

One aspect is a liquid crystal display device, including: a first substrate, a thin film transistor formed in a first, non-transmissive region on the first substrate, including a gate electrode, a source electrode and a drain electrode, and a storage capacitor formed in a second, transmissive region on the first substrate, where a first electrode and a second electrode of the storage capacitor are made of a transparent conductive material.

Another aspect is a method of fabrication of a liquid crystal display device, the method including: forming a gate electrode of a thin film transistor and a first electrode of a storage capacitor on a first substrate, where the gate electrode includes a transparent conductive material, and a low-resistance metal, stacked together, forming a second electrode of the storage capacitor on a first insulating layer overlapping the first electrode, forming a second insulating layer including a depressed pattern exposing a portion of the second electrode, forming a domain forming layer, and forming a pixel electrode on the domain forming layer overlapping the second electrode, where the first electrode and the second electrode of the storage capacitor include a transparent conductive material.

Another aspect is a liquid crystal display device, including: a first substrate including: a storage capacitor including a thin film transistor disposed in a non-transmissive region, a transparent first electrode, a dielectric film, and a transparent second electrode which are sequentially formed in a transmissive region, and a pixel electrode, a second substrate facing the first substrate and having a common electrode, and a liquid crystal layer disposed between the first substrate and the second substrate, where the transmissive region is the region where the pixel electrode overlaps the common electrode.

BRIEF DESCRIPTION OF THE DRAWINGS

The accompanying drawings, together with the disclosure, illustrate certain exemplary embodiments of the present invention.

DETAILED DESCRIPTION OF CERTAIN INVENTIVE EMBODIMENTS

The drawings and description are to be regarded as illustrative in nature and not restrictive. When an element is referred to as being "on" another element, it can be directly on the other element or be indirectly on the other element with one or more intervening elements interposed therebetween. When an element is referred to as being "connected to" another element, it can be directly connected to the other element or be indirectly connected to the other element with one or more intervening elements interposed therebetween. Like reference numerals generally refer to like elements.

Herein, i) a shape, a size, a ratio, an angle, a number, etc. shown in the accompanying drawing are schematically shown and therefore, can be slightly changed. ii) since the drawings are shown with observer's eyes, a direction or a position explaining the drawings can be variously changed according to the position of the observer. iii) although different reference numerals can be used, like reference numerals can refers to like components iv) when 'comprising', 'having', 'consisting of', etc. are used, other components can be added unless 'only' is used. v) even when a component is explained in singular number they may be interpreted as plural number. vi) even though a shape, a size comparison, a positional relation, etc., are not described as 'about', 'substantially', etc., they are to be interpreted as including general tolerance. vii) even though terms such as 'after', 'before', 'next to', 'and', 'herein', 'subsequent to', 'at this time', etc. are used, they are not used as limiting temporal position. viii) terms such as 'first', 'second', 'third', etc., are selectively, compatibly, repeatedly, used for make convenience of division simple and are interpreted as a limiting meanings. ix) when positional relation of two portions is explained by 'on', 'upper', 'lower', 'beside', etc., one or more components may be positioned between two portions unless 'just' is not used. x) when portions are connected by 'or', the portions are interpreted as including 'alone' as well as 'combination thereof' but when portions are connected by 'or', 'one of', portions are interpreted as 'alone'.

Figure 1:
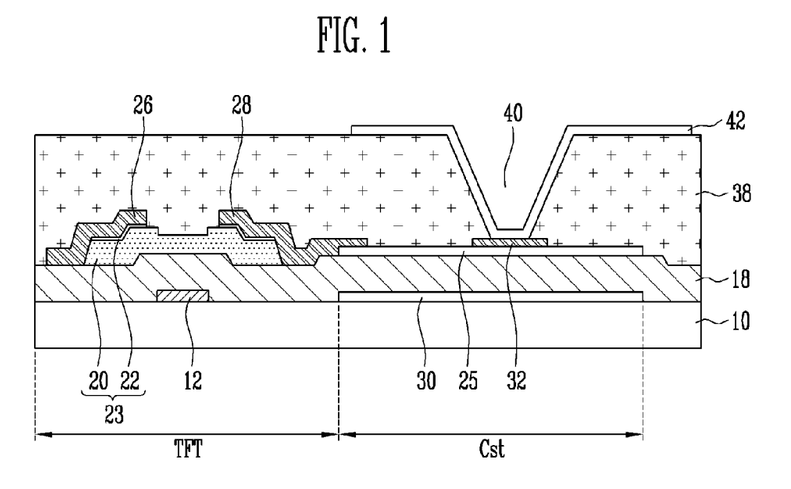
FIG. 1 is a cross-sectional view of an embodiment of a liquid crystal display device.

FIG. 1 is a cross-sectional view of an embodiment of a liquid crystal display device.

The embodiment shown in FIG. 1 exemplifies a twisted nematic (TN) or vertical alignment (VA) mode liquid crystal display device, and for convenience of description, a lower substrate including a thin film transistor and a storage capacitor is shown.

Referring to FIG. 1, an embodiment of a liquid crystal display device includes a lower substrate 10, and a thin film transistor TFT formed on a first region and a storage capacitor Cst on a second region of the lower substrate 10.

The thin film transistor TFT includes a gate electrode 12 formed on the lower substrate 10, a gate insulating layer 18 formed on the gate electrode 12, a semiconductor layer 23 formed on the gate insulating layer 18, and a source electrode 26 and a drain electrode 28 formed on the semiconductor layer 23.

The gate electrode 12 is electrically connected to a gate line (not shown) and receives a gate signal from the gate line. The gate insulating layer 18 is formed on the gate electrode 12 to electrically insulate the gate electrode 12 from the source/drain electrodes 26 and 28.

The semiconductor layer 23 forms a conduction channel between the source electrode 26 and the drain electrode 28. The semiconductor layer 23 includes an active layer 20 and an ohmic contact layer 22 formed the active layer 20 and the source/drain electrodes 26 and 28. The active layer 20 may be made of amorphous silicon in which impurity is undoped and the ohmic contact layer 22 may be made of amorphous silicon in which N type or P type impurities are doped. The semiconductor layer 23 supplies a voltage, supplied to the source electrode 26, to the drain electrode 28, when the gate signal is supplied to the gate electrode 12.

The storage capacitor Cst comprises a storage lower electrode 30 and a storage upper electrode 25, and a gate insulating layer 18 therebetween. The storage lower electrode 30 may be made of a transparent conductive material, and may be on the same layer as the gate electrode 12. In some embodiments, the storage lower electrode 30 may be made of ITO (indium tin oxide), TO (tin oxide), IZO (indium zinc oxide), and ITZO (indium tin zinc oxide).

The storage upper electrode 25 is electrically connected to the drain electrode 28. The storage upper electrode 25 may be made of the same transparent conductive material as the storage lower electrode 30. The storage upper electrode 25 is electrically connected to a pixel electrode 42 through a contact hole 40. A contact electrode 32 is formed on the storage upper electrode 25 and is exposed by the contact hole 40.

The contact electrode 32 may be made of a material with a lower resistance than the transparent conductive material. In some embodiments, the contact electrode 32 may be made of the same material as the drain electrode 28 to lower the resistance of the storage upper electrode 25. The contact electrode 32 is electrically connected to the pixel electrode 42.

A passivation layer 38 is formed between the storage upper electrode 25 and the pixel electrode 42. The passivation layer 38 is formed to cover the source electrode 26, the drain electrode 28, the storage upper electrode 25, and the contact electrode 32.

In the embodiment shown in FIG. 1, electrodes 25 and 30 of the storage capacitor are made of a transparent conductive material.

Generally, liquid crystal display devices are classified into large liquid crystal display devices, which are typically over 11 inches, and medium and small-sized liquid crystal display devices, which are typically below 11 inches in the size of the picture.

Medium and small-sized liquid crystal display devices are generally smaller in pixel size than large liquid crystal display devices. The storage capacitor of medium and small-sized devices may be disposed in a transmissive region of a pixel. The transmissive region includes a region where a pixel electrode 42 formed on the lower substrate 10 overlaps the common electrode (not shown) of the upper substrate (not shown).

When the electrodes of the storage capacitor are made of opaque materials, the transmissive region of the medium and small-sized liquid crystal display device decreases, and the aperture ratio is significantly reduced.

In an embodiment of the present invention, it is possible to avoid reduction in the aperture ratio by forming the electrodes 25 and 30 of the storage capacitor using a transparent conductive material.

Figure 2:
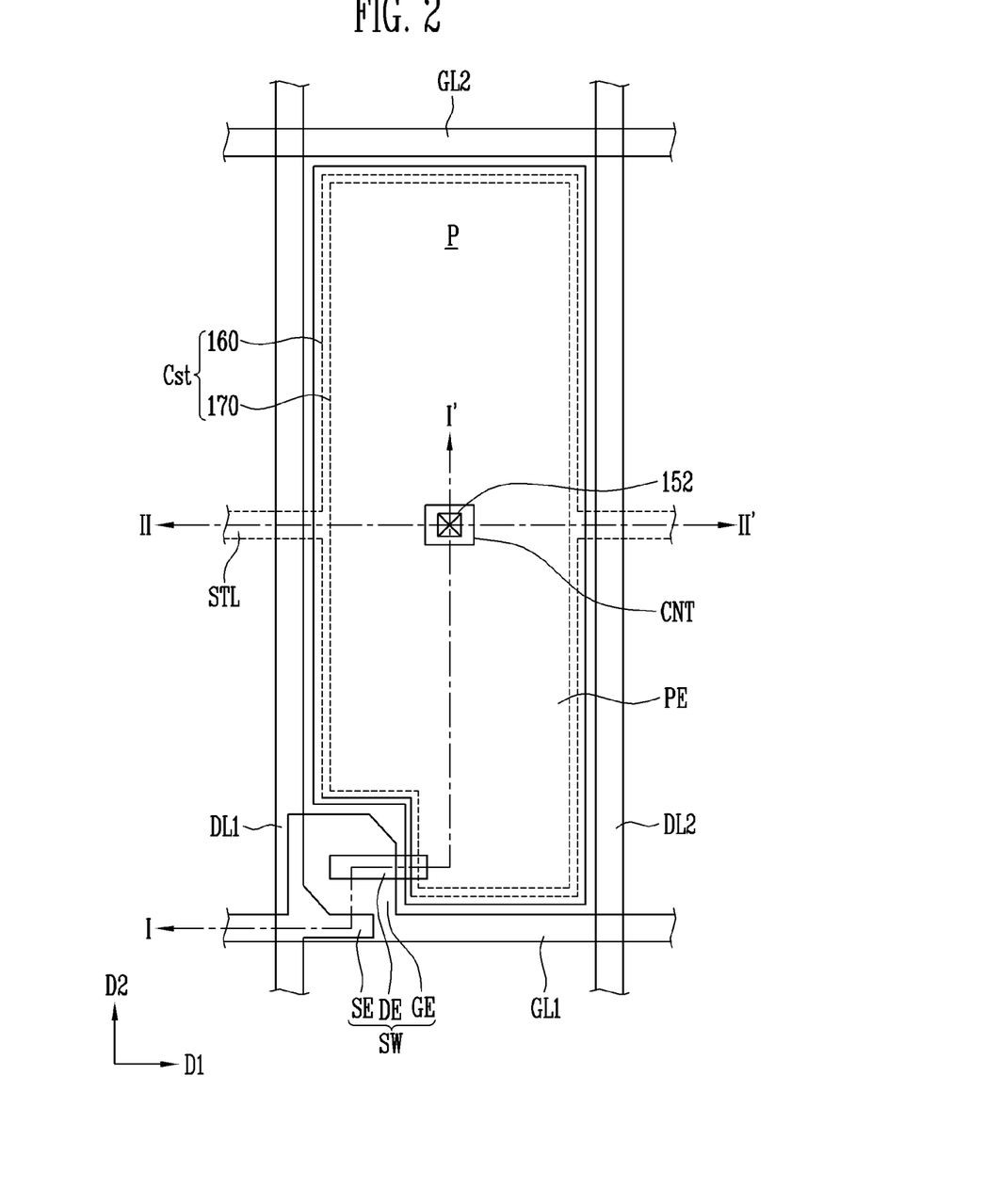
FIG. 2 is a plan view of another embodiment of a liquid crystal display device.
Figure 3A:
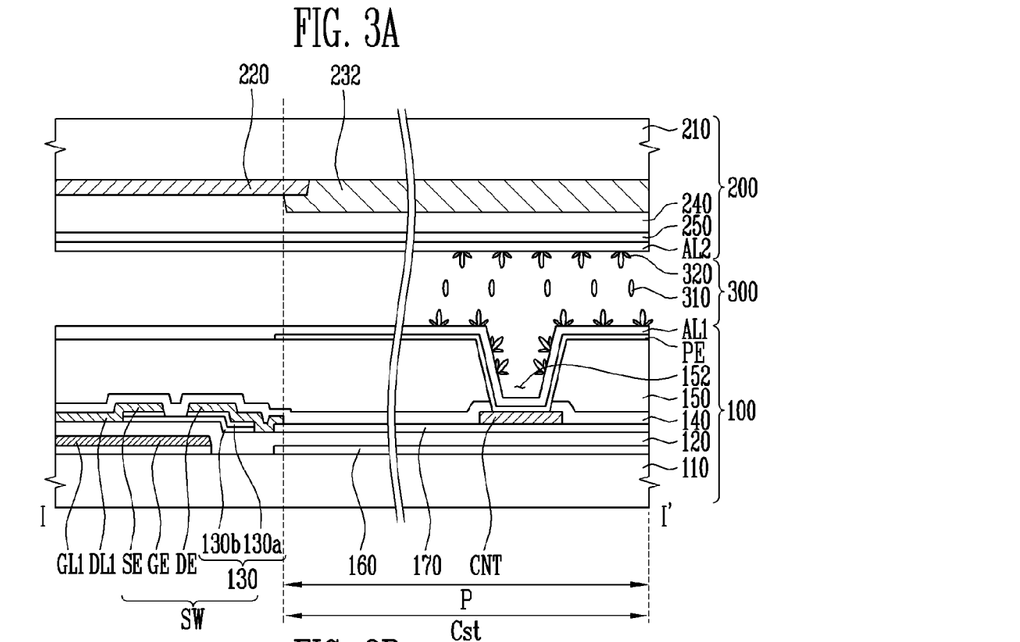
FIG. 3A is a cross-sectional view taken along line I-I' of FIG. 2.

FIG. 2 is a plan view of another embodiment of a liquid crystal display device. FIG. 3A is a cross-sectional view taken along line I-I' of FIG. 2 and FIG. 3B is a cross-sectional view taken along line II-II' of FIG. 2.

Figure 3B:
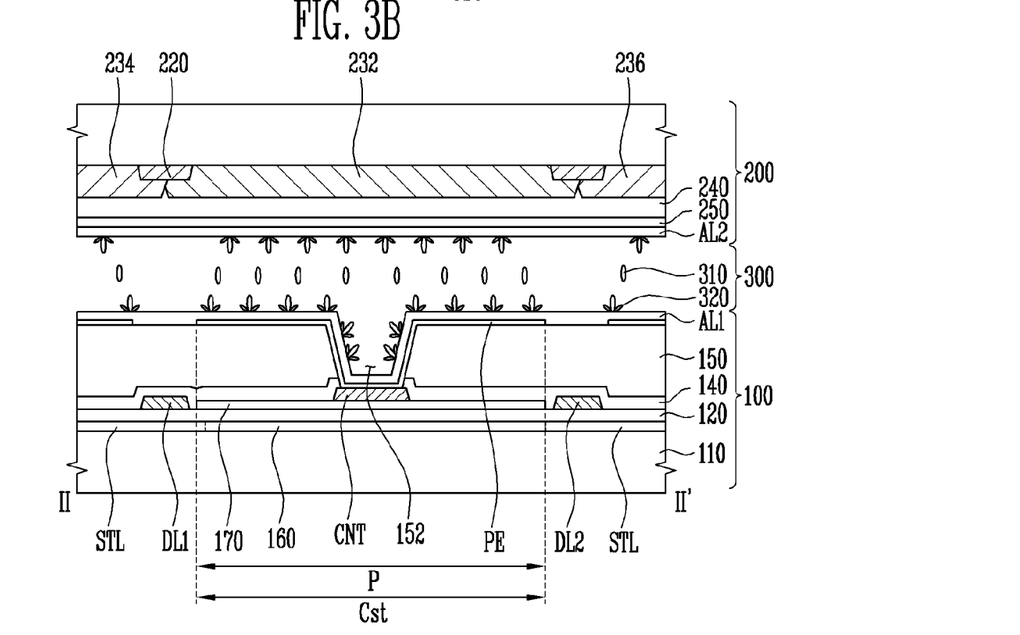
FIG. 3B is a cross-sectional view taken along line II-II' of FIG. 2.
Figure 3C:
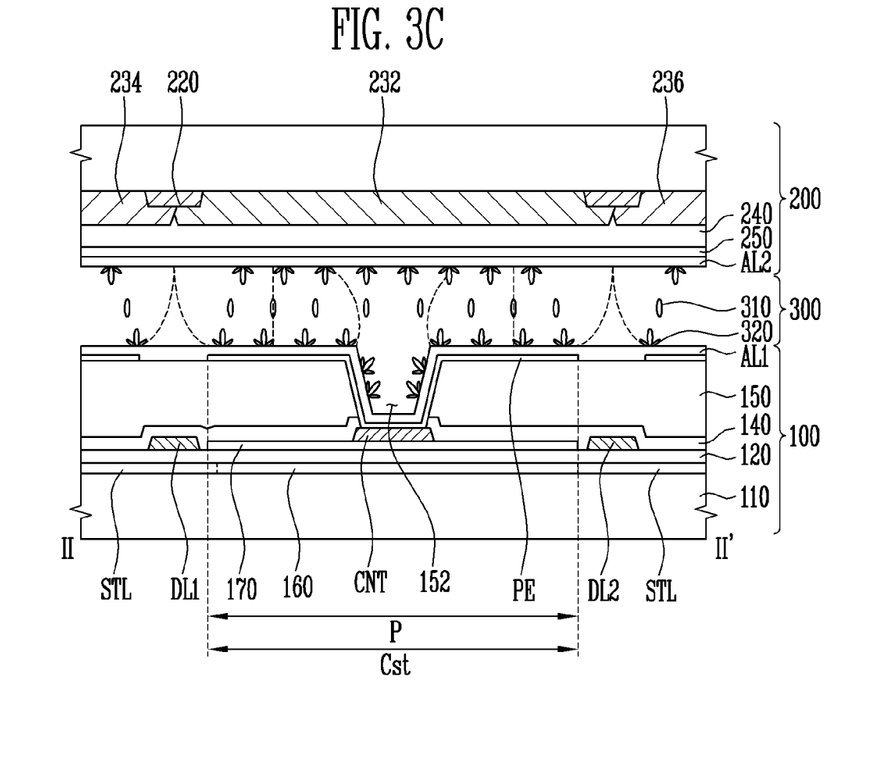
FIG. 3C is a cross-sectional view illustrating application of voltage to the embodiment of the display device shown in FIG. 3B.

The embodiment shown in FIGS. 2 and 3 exemplify a High Vertical Alignment (HVA) mode, which generally improves a viewing angle of the liquid crystal display device by forming a liquid crystal domain therein.

FIGS. 3A and 3B show the liquid crystal display when there is no voltage applied between the pixel electrode and the common electrode. For the convenience of description, the embodiment of the display device shown includes a thin film transistor having a semiconductor layer including amorphous silicon and a bottom gate structure. Other embodiments may not include a thin film transistor.

Referring to FIGS. 2, 3A, and 3B, the display device includes a first substrate 100, a second substrate 200, and a liquid crystal layer 300.

The first substrate 100 includes a first base member 110, a first gate line GL1, a second gate line GL2, a first insulating layer 120, a first data line DL1, a second data line DL2, a thin film transistor SW that is a switching element, a second insulating layer 140, a domain forming layer 150, a pixel electrode PE, and first alignment layer AL1.

A storage line STL may be connected with a first electrode 160 of the storage capacitor overlapping the pixel electrode PE. A second electrode 170 of the storage capacitor may be disposed between the first electrode 160 and the pixel electrode PE to at least partially overlap the first electrode 160. A storage capacitor Cst of each pixel may be formed by the first electrode 160 and the second electrode 170 included in the storage capacitor.

As described above, the medium and small-sized liquid crystal display devices (under 11 inches) are smaller in pixel size than larger liquid crystal display devices used for TVs, for example. The storage capacitor of medium and small-sized devices is disposed in a transmissive region P of the pixel. Accordingly, the transmittance is considerably reduced, when the first electrode 160 and the second electrode 170 of the storage capacitor include an opaque conductive material.

Liquid crystal display devices, unlike organic electro-luminescence display devices, are generally equipped with a backlight unit (not shown) providing light under the first substrate 100. The areas of the first electrode 160 and the second electrode 170 formed of an opaque conductive material cannot be sufficiently increased in order to achieve desired transmittance. Therefore, it may be difficult to ensure sufficient capacitance of the storage capacitor, due to the limited expansion of the first electrode 160 and the second electrode 170.

In some embodiments of the present invention, at least one of the first electrode 160 and the second electrode 170 of the storage capacitor may include a transparent conductive material. In some embodiments, the first electrode 160 and the second electrode 170 may include a transparent conductive material and an opaque conductive material, respectively. In other embodiments, the first electrode 160 and the second electrode 170 may include an opaque conductive material and a transparent conductive material, respectively. In yet other embodiments, both of the first electrode 160 and the second electrode 170 may include a transparent conductive material.

In such embodiments, reduction of transmittance is relatively small, even if the area of at least one of the first electrode 160 and the second electrode 170 increases. Therefore, it is possible to increase the areas of the first electrode 160 and the second electrode 170 to increase the capacitance between the first electrode 160 and the second electrode.

The pixel electrode PE may correspond to the transmissive region P. In this configuration, at least one of the first electrode 160 and the second electrode 170 may extend to substantially correspond to the size of pixel electrode PE in some embodiments. In other embodiments, at least one of the first electrode 160 and the second electrode 170 may be formed wider than the pixel electrode PE. In such embodiments, at least one of the first electrode 160 and the second electrode 170 may overlap with a black matrix pattern 220 disposed in a non-transmissive region.

The reduction of transmittance is relatively small, even if at least one of the first electrode 160 and the second electrode 170 are formed in an area corresponding to the entire transmissive region P is made to overlap the pixel electrode PE substantially corresponding to the pixel region P of the pixel. It is thus possible to increase the capacitance by expanding one of the first electrode 160 and the second electrode 170 to the non-transmissive region.

In some embodiments, the transparent conductive material may include ITO (indium tin oxide), TO (tin oxide), IZO (indium zinc oxide), and ITZO (indium tin zinc oxide). These materials may be used alone or in combination.

The first and second gate lines GL1 and GL2 may extend in a first direction D1 on the first base member 110. The first and second data lines DL1 and DL2 may be arranged substantially in parallel in a second direction D2 different from the first direction D1. The second direction D2, for example, may be perpendicular to the first direction D1. The storage line STL is disposed between the first and second gate lines GL1 and GL2 and may extend in the first direction D1. The first insulating layer 120 may be formed on the first base member 110 to cover the first and second gate lines GL1 and GL2, the storage line STL, and the first electrode 160.

The first and second data lines DL1 and DL2 may extend in the second direction D2 on the first insulating layer 120, and the first and second data lines DL1 and DL2 may cross the first and second gate lines GL1 and GL2 and the storage line STL. The first substrate 100 may be provided with pixel regions divided by the first and second gate lines GL1 and GL2 and the first and second data lines DL1 and DL2. A pixel electrode PE may be formed in the transmissive region P of the pixel region. In some embodiments, the pixel regions may be formed by the first and second gate lines GL1 and GL2 and the first and second data lines DL1 and DL2.

The pixel region may be divided into the transmissive region P where the pixel electrode PE and the first and second electrode 160 and 170 are formed, and a thin film transistor region where a thin film transistor SW is formed.

The thin film transistor SW may include a gate electrode GE connected with the first gate line GL1, a semiconductor layer 130 formed on an insulating layer 120 to correspond to the gate electrode GE, a source electrode SE connected with the first data line DL1 and overlapping the semiconductor layer 130, and a drain electrode DE disposed apart from the source electrode SE1 and overlapping the semiconductor layer 130.

The semiconductor layer 130 may include an active layer 130a and an ohmic contact layer 130b formed on the first insulating layer 120.

In some embodiments, the end of the drain electrode DE may be electrically connected with the second electrode 170, which is the upper electrode of the storage capacitor.

A second insulating layer 140 may be formed on the first insulating layer 120 to cover the first and second data lines DL1 and DL2, the source electrode SE, and the drain electrode DE.

The domain forming layer 150 may be formed on the second insulating layer 140, planarizing the first substrate 100.

The domain forming layer 150 may have a depressed pattern 152 recessed down from the surface. The depressed pattern 152 may be formed in the transmissive region P, forming a liquid crystal domain of the transmissive region P. The depressed pattern 152 may be a dot type, and the domain forming layer 150 and the second insulating layer 140 which correspond to the position of the depressed pattern 152 may be open such that the second electrode 170 is exposed.

In some embodiments, a contact electrode CNT may be formed under the open depressed pattern 152. The contact electrode CNT may be formed in an island shape on the second electrode 170. The contact electrode CNT corresponds to the region that is opened by the depressed pattern 152. The contact electrode CNT may be formed of the same material as the source electrode SE and the drain electrode DE of the thin film transistor. In some embodiments, the contact electrode CNT may include low-resistance metal.

The depressed pattern 152 may be a dot type hole exposing a portion of the contact electrode CNT. The depressed pattern 152 may include an organic substance or an inorganic substance. In some embodiments, the domain forming layer 150 may include an organic layer made of the organic substance and an inorganic layer made of the inorganic substance, and the depressed pattern 152 may be formed on the organic layer or the inorganic layer.

The pixel electrode PE is formed on the domain forming layer 150 in the transmissive region P. The pixel electrode PE may include a transparent conductive material. The pixel electrode PE may be formed to cover the entire depressed pattern 152. The pixel electrode PE may be electrically connected with the thin film transistor SW by contacting the contact electrode CNT through the depressed pattern 152.

High resistance of the first and second electrodes 160 and 170, when such electrodes are formed using transparent conductive material, may be overcome by forming a contact electrode CNT using low-resistance metal.

In a region having the same planar area, the pixel electrode PE on the depressed pattern is larger in area than the pixel electrode PE formed on a flat region of the domain forming layer 150. Therefore, when an electric field is generated between the first substrate 100 and the second substrate 200, the magnitude of the electric field the closest to the depressed pattern 152 may be larger than the magnitude of the electric field in the flat region.

The first alignment layer AL1 may be formed throughout the first base member 110 including the pixel electrode PE.

The second substrate 200 may include a second base member 210 opposite the first substrate 100, a black matrix pattern 220, first, second, and third color filters 232, 234, and 236, an overcoating layer 240, a common electrode layer 250, and a second alignment layer AL2. In some embodiments, the second substrate 200 may not include the overcoating layer 240.

The black matrix pattern 220 may be formed on a second base member 210 corresponding to the region formed by the first and second gate lines GL1 and GL2, the first and second data lines DL1 and DL2, and the thin film transistor SW. The first, second, and third color filters 232, 234, and 236 may be formed in regions divided by the black matrix pattern 220 on the second base member 210. In some embodiments, the first color filter 232 may be formed in the region corresponding to the transmissive region P, where the pixel electrode PE is formed, on the second base member 210. The second color filter 234 may be formed in the first direction D1 of the first color filter 232 and the third color filter 236 may be formed in opposite direction to the first direction D1 of the first color filter 232. The overcoating layer 240 may be formed on the region where the black matrix pattern 220 and the first, second, and third color filters 232, 234, and 236 may be formed, on the second base member 210, and may planarize the second substrate 200.

The common electrode 250 may be formed on the overcoating layer 240. The common electrode 250 may include a transparent conductive material.

In some embodiments, the common electrode may be formed throughout the second substrate 200, without a specific pattern. The liquid crystal domain of the liquid crystal layer 300 may be formed by the pixel electrode PE, which can change the magnitude of the electric field, using the depressed pattern 152, and the patternless common electrode 250.

The second alignment layer AL2 may be formed on the common electrode 250 above the second base member 210. The second alignment layer AL2 may be formed throughout the second substrate 200.

The liquid crystal layer 300 may be disposed between the first substrate 100 and the second substrate 200. The liquid crystal layer 300 may include liquid crystal molecules 310 and reactive mesogen (RM) hardened material 320.

The liquid crystal molecules 310 react differently to the electric field generated between the pixel electrode PE and the common electrode 250, which makes it possible to adjust the light transmittance. The liquid crystal molecules 310, for example, may have negative dielectric anisotropy.

When there is no voltage supplied to the pixel electrode PE and the common electrode 250, the liquid crystal molecules 310 close to the first substrate 100 and/or the second substrate 200 may be arranged with their long axes perpendicular to the surface of the second base member 210 and/or the first base member 110. The liquid crystal molecules 310 close to the depressed pattern 152 may be arranged with their long axes perpendicular to the side of the domain forming layer 150 forming the depressed pattern 152.

The RM hardened material 320 may be disposed between the liquid crystal molecules 310. The RM hardened material 320 may be disposed between the liquid crystal molecules 310 closest to the pixel electrode PE and/or the common electrode 250 The RM hardened material 320 may be disposed between the liquid crystal molecules 310 close to the first alignment layer AL1. The RM hardened material 320 may be disposed between the liquid crystal molecules 310 close to the second alignment layer AL2.

Even if an electric field is not generated between the pixel electrode PE and the common electrode 250, the RM hardened material 320 can keep the liquid crystal molecules 310 closest to the first substrate 100 and/or the second substrate pre-tilted with respect to the surface of the first base member 110 and/or second base member 210. RM hardened material 320 may be formed by RM monomers that are polymerized by external light in the process of manufacturing the display device.

In some embodiments, the external light may be ultraviolet rays. The RM monomers are photo-reacted and polymerized by the external light, such that the RM hardened material 320 is created between the liquid crystal molecules 310.

The RM monomers are converted into the RM hardened material 320 attached to the pixel electrode PE and the common electrode 250, by radiating ultraviolet rays of about 10 to 15 J for 6 to 7 minutes, with voltage applied to the pixel electrode PE and the common electrode 250, and radiating strong ultraviolet rays of about 15 J for 50 to 60 minutes, with no voltage supplied to the pixel electrode PE and the common electrode 250.

If the first electrode 160 and the second electrode 170 both include only reflective or opaque conductive materials, the RM hardened material 320 may not be completely created or the RM hardened material 320 may not be attached to the region where the first electrode 160 overlaps the second electrode 170. In some embodiments, a transparent conductive material is provided in at least one of the first electrode 160 and the second electrode 170 to completely create or attach the RM hardened material.

In such embodiments, it is possible to form the liquid crystal domain, using the depressed pattern 152 on the domain forming layer 150, without forming a specific pattern on the common electrode 250. Since no pattern is formed on the common electrode 250, it is possible to remove the cause of misalignment of the first substrate 100 and the second substrate 200.

It is also possible to simplify the manufacturing process by removing a specific patterning process for patterning the common electrode 250. This may help improve productivity and display quality of the display device.

In the embodiment shown in FIGS. 2 and 3, the first electrode 160 and the second electrode 170 may have a thickness of about 150 Å to about 1500 Å, and the first insulating layer 120 formed between the first and second electrode may have a thickness of about 400 Å to about 6000 Å.

In embodiments where the liquid crystal display device is achieved with the thicknesses of the first and second electrodes 160 and 170 and the first insulating layer 120 optimized as described above, the transmittance of the light emitted through the first and second substrates from the backlight (not shown) under the first substrate 100 is 80% to 99.5%.

FIG. 3C is a cross-sectional view illustrating application of voltage to the embodiment of the display device shown in FIG. 3B.

Referring to FIG. 3C, when an electric field is generated between the pixel electrode PE and the common electrode 250, the direction of the electric field within the pixel region is perpendicular to the surface of the first substrate 100 and/or the second substrate 200.

The electric field lines may be curved between the end of the pixel electrode PE and the common electrode 250. The electric field lines may also be curved between the end of another pixel electrode, adjacent to the pixel electrode PE, and the common electrode 250. The liquid crystal molecules 310 are aligned to be dissipated to different points of the common electrode 250 in adjacent pixel electrodes PE, such that the liquid crystal domain may be divided between adjacent pixel regions.

In the shape of the electric field at a region close to the depressed pattern 152, the electric field may converge to one point of the common electrode 250, for example, the common electrode 250 corresponding to the depressed pattern 152, by the pre-tilt due to the sides of the depressed pattern 152.

Embodiments of the invention used to implement HVA mode liquid crystal display devices which improve the viewing angle by forming a liquid crystal domain, help ensure sufficient electrostatic capacity while decreasing the reduction of transmittance by forming both of the first electrode 160 and the second electrode 170, using a transparent conductive material in the area corresponding to the entire pixel region to overlap the pixel electrode corresponding to the pixel region P.

Fabrication Method of Liquid Crystal Display Device

Embodiments of a method of fabrication of a liquid crystal display device will be described with reference to FIGS. 4 to 6.

Figure 4A:
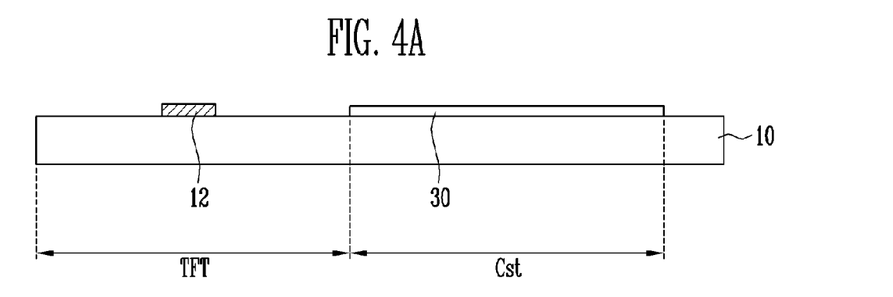
FIGS. 4A to 4E are cross-sectional views illustrating an embodiment of a manufacturing process of the embodiment of a liquid crystal display device shown in FIG. 1.
Figure 4B:
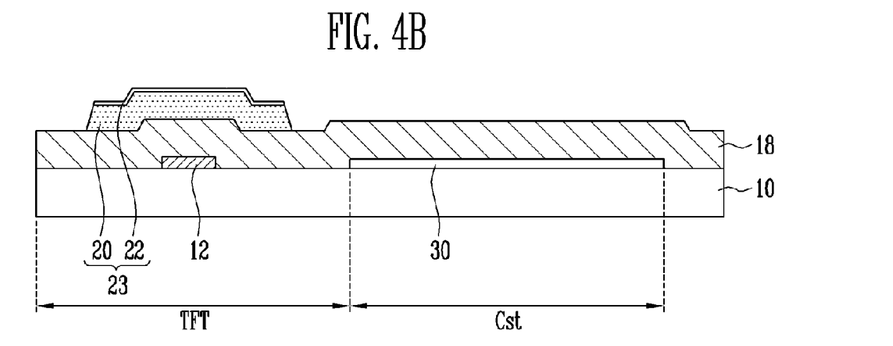

FIGS. 4A to 4B are cross-sectional views illustrating an embodiment of a manufacturing process of the embodiment of a liquid crystal display device shown in FIG. 1.

Referring to FIG. 4A, a gate electrode 12 is formed in the thin film transistor TFT-forming region on the lower substrate 10. The gate electrode 12 is stacked on the lower substrate 10 by deposition, such as sputtering. The gate electrode 12 may be made of Al, Mo, Cr, or Cu.

A storage lower electrode 30 is formed in the storage capacitor Cst-forming region on the lower substrate 10 by deposition. The storage lower electrode 30 is made of a transparent conductive material. In some embodiments, the storage lower electrode 30 may be made of any one of ITO, TO, IZO, and ITZO.

As shown in FIG. 4B, the gate insulating layer 18 is formed on the lower substrate 10. The semiconductor layer 23, including the active layer 20 and the ohmic contact layer 22, is formed in the thin film transistor TFT-forming region.

The gate insulating layer 18 is formed by depositing an inorganic insulating substance, such as silicon nitride SiNx and silicon oxide SiOx, to the entire surface of the lower substrate 10, using a deposition process, such as PECVD (Plasma Enhanced Chemical Vapor Deposition). An amorphous silicon layer and an amorphous silicon layer with dopant are formed. The semiconductor layer 23, including the active layer 20 and the ohmic contact layer 22, is formed by patterning the amorphous silicon layer and the amorphous silicon layer with dopant, using photolithography and etching.

Figure 4C:
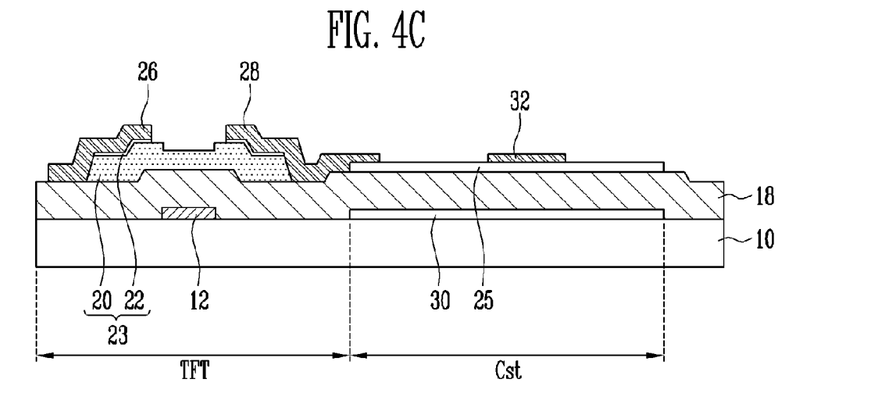

As shown in FIG. 4C, a storage upper electrode 25 is formed in the storage capacitor Cst-forming region, by deposition. The storage upper electrode 25 is made of a transparent conductive material. In some embodiments, the storage upper electrode 25 may be made of any one of ITO, TO, IZO, and ITZO.

A source electrode 26, a drain electrode 28, and a contact electrode 32 are formed by deposition, such as sputtering. In some embodiments, the sputtering processing may include forming the electrodes by being deposited with metal (e.g. Mo or MoW) and then patterning by photolithography or etching. The active layer 20 is exposed by removing the ohmic contact layer 22 exposed between the two electrodes 26 and 28, using as a mask the source electrode 26 and the drain electrode 28. The drain electrode 28 partially overlaps the storage upper electrode 25, allowing it to be electrically connected with the storage upper electrode 25 The storage capacitor Cst can thus be charged with the pixel voltage supplied to the drain electrode 28 through the source electrode 26.

The contact electrode 32 is formed in a portion of the storage upper electrode 25. The contact electrode 32 is positioned at a region overlapping a contact hole 40 of a passivation layer 38.

Figure 4D:
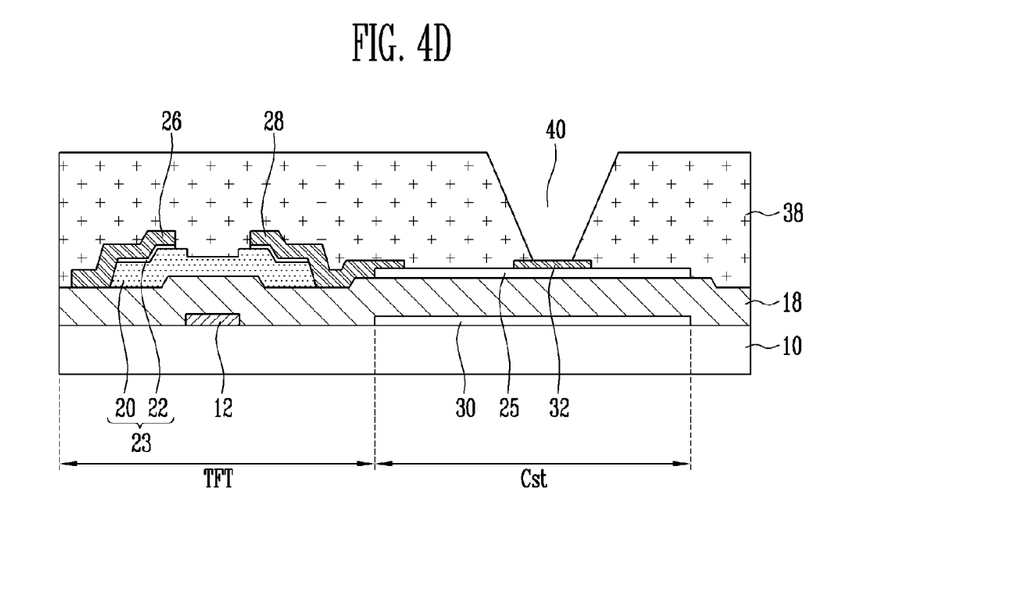

As shown in FIG. 4D, the passivation layer 38 is formed to cover the source electrode 26, drain electrode 28, and storage upper electrode 25. In some embodiments, the passivation layer is formed by PECVD, spin coating, or spinless coating, and the like. The contact hole 40 is formed by patterning the passivation layer 38, using photolithography and etching. The contact hole 40 is positioned at a region overlapping the contact electrode 32. In some embodiments, the passivation layer 38 may be made of an inorganic insulating substance, or an organic insulating substance, such as acryl.

Figure 4E:
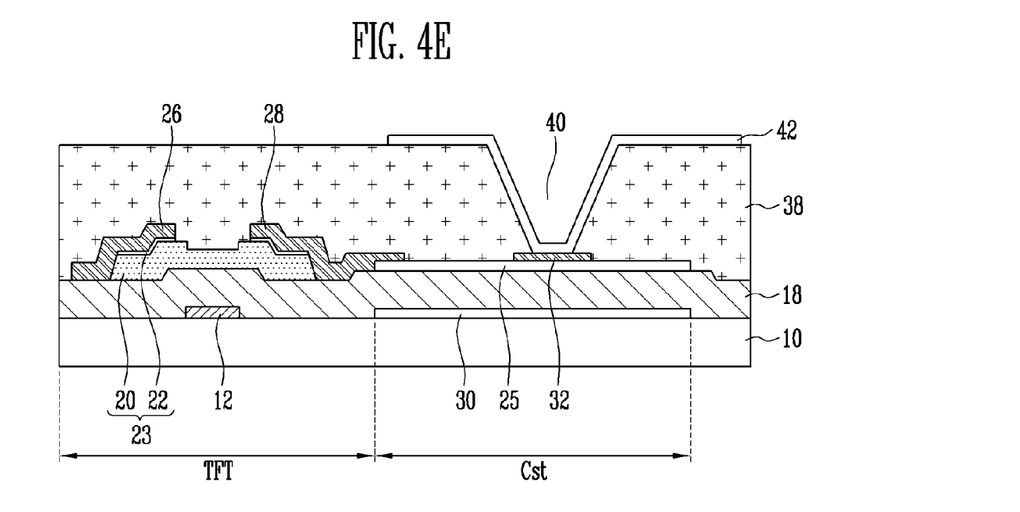

As shown in FIG. 4E, a pixel electrode 42 is formed on the passivation layer 38. The pixel electrode 42 is formed by deposition, such as sputtering. The pixel electrode 42 electrically contacts with the contact electrode 32 through the contact hole 40. This electrical contact controls the electric field of the liquid crystal which corresponds to the voltage charged in the storage capacitor Cst. In some embodiments, the pixel electrode 42 may be made of a transparent conductive material, such as ITO, TO, IZO, and ITZO.

In embodiments where the storage upper electrode 25 and the storage lower electrode 30 are made of a transparent conductive material, it is possible to increase the overlap area of the storage upper electrode 25 and the storage lower electrode 30 irrespective of the aperture ratio. Therefore, it is possible to achieve a high-capacity storage capacitor Cst and thereby improve reliability in driving. It is also possible to ensure high aperture ratio. In some embodiments, the increase in resistance due to the use of transparent conductive material is minimized by forming the contact electrode 32 of metal in the contact portion between the storage upper electrode 25 and the pixel electrode 42.

FIGS. 5A to 5E are cross-sectional views illustrating an embodiment of a manufacturing process of the first substrate in the cross section of an embodiment of a liquid crystal display device as shown in FIG. 3A.

Figure 5A:
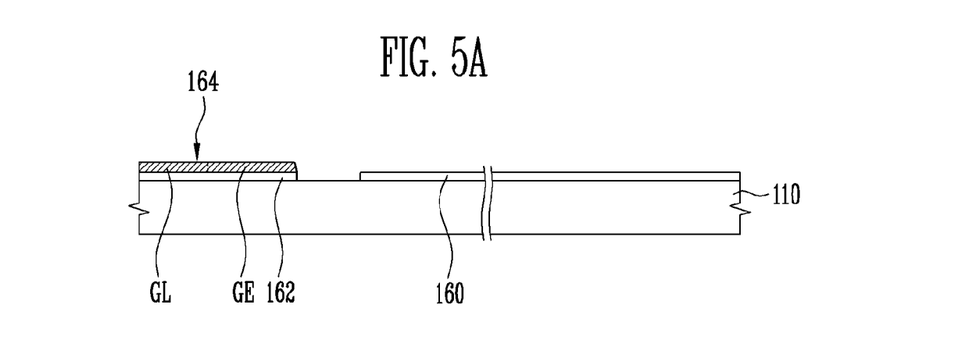
FIGS. 5A to 5E are cross-sectional views illustrating an embodiment of a manufacturing process of a portion of an embodiment of a liquid crystal display device shown in FIGS. 2 and 3.

Referring to FIG. 5A, a transparent conductive material 162 and a low-resistance metal 164 are deposited on a substrate 110. A gate line GL, a gate electrode GE, and a first electrode 160 of a storage capacitor are formed by patterning.

In some embodiments, the first electrode may be integrally formed with a storage line STL and may include a transparent conductive material.

In typical manufacturing processes, the first electrode 160 is positioned on the same layer as the gate line GL and the gate electrode GE, and the gate line GL and the gate electrode GE are made of different materials. In such processes, a mask process is added to form the first electrode 160, a process which is additional to the mask process used to form the gate line GL and the gate electrode GE, increasing the manufacturing cost and the process time. For example, in some manufacturing processes, the gate line GL and the gate electrode GE include a low-resistance opaque metal, such as Mo, and the first electrode includes a transparent conductive material, such as ITO. In such processes, it may be difficult to form the first electrode 160 with the mask used for forming the gate line GL and the gate electrode GE.

In some embodiments of the present invention, the gate line GL/gate electrode GE and the first electrode are simultaneously formed by using a halftone mask process without adding an additional mask.

In such embodiments, the gate line GL/gate electrode GE are implemented by a structure in which transparent conductive material 162 and the low-resistance metal 164 are stacked. The thickness of the photoresistor PR disposed in the region where the first electrode 160 is formed is made to be smaller than the thickness of the photoresistor disposed in the region where the gate line/gate electrode are formed. Consequently, by performing the photo process, the gate line GL/gate electrode GE have a structure in which the transparent material 162 and the low-resistance metal 164 are stacked but only the first electrode 160 remains because the low-resistance material on the first electrode 160 is completely removed. Therefore, it is possible to simultaneously form the gate line GL/gate electrode GE and the first electrode 160 without adding an additional mask process.

In some embodiments, the transparent conductive material may include ITO (indium tin oxide), TO (tin oxide), IZO (indium zinc oxide), and ITZO (indium tin zinc oxide). These materials may be used alone or in combination.

In some embodiments, the low-resistance metal may be Mo, Al, AlNd, and Ti, and the like. which may be used alone or in combination.

Figure 5B:
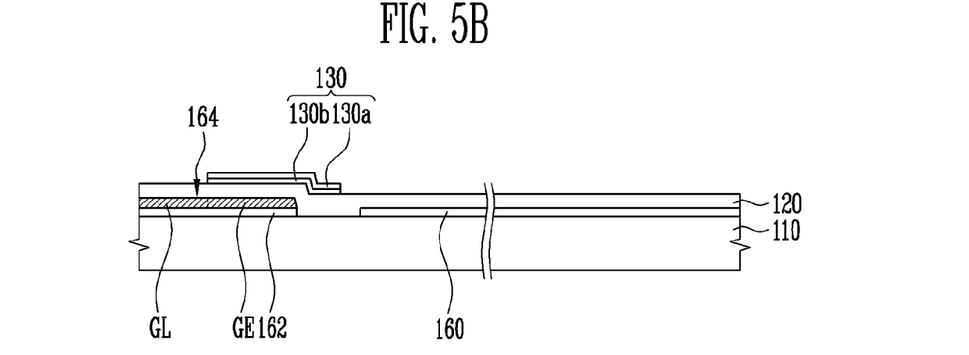

As shown in FIG. 5B, a first insulating layer 120 is formed on the substrate 110 with the gate line GL/gate electrode GE and the first electrode 160, and a semiconductor layer 130 including an active layer 130a and an ohmic contact layer 130b is formed in the thin film transistor-forming region.

The first insulating layer 120 is formed by depositing an inorganic insulating substance, such as silicon nitride SiNx and silicon oxide SiOx, onto the substrate, using deposition, such as PECVD. An amorphous silicon layer and an amorphous silicon layer with dopant are formed. The semiconductor layer 130, including the active layer 130a and the ohmic contact layer 130b, is formed by patterning the amorphous silicon layer and the amorphous silicon layer with dopant, using photolithography and etching.

Figure 5C:
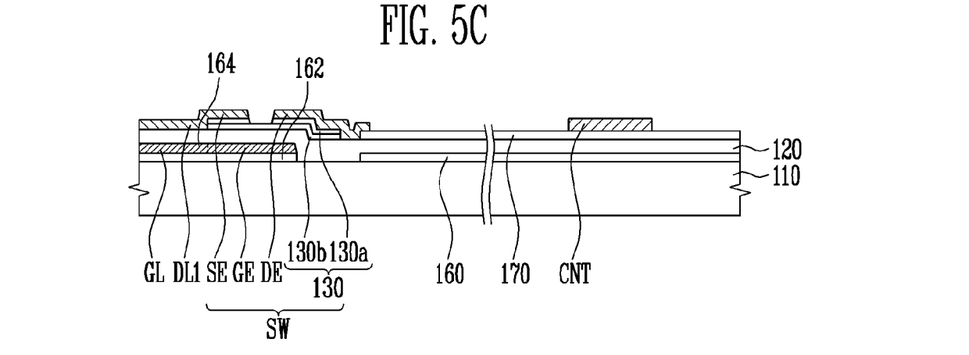

A second electrode 170 of the storage capacitor is formed in the region overlapping the transmissive region P, or the first electrode 160, as shown in FIG. 3C. In some embodiments, the second electrode 170 may be made of a transparent conductive material. The transparent conductive material may be ITO, TO, IZO, and ITZO etc. These materials may be used alone or in combination.

In some embodiments, since both of the first electrode 160 and the second electrode 170, which are used as the electrodes of the storage capacitor, include a transparent conductive material, they can be formed to have an area corresponding to the entire transmissive region to overlap the pixel electrode PE corresponding to the transmissive region of the pixel. Therefore, it is possible to ensure sufficient electrostatic capacity, decreasing the reduction of transmittance.

A data line DL, a source electrode SE, a drain electrode DE, and a contact electrode CNT are formed. The source electrode SE, drain electrode DE, and contact electrode CNT may be formed by deposition, such as sputtering. The source electrode SE, drain electrode DE, and contact electrode CNT may be formed by being deposited with metal (e.g. Mo or MoW) and then performing photolithography. The active layer 130a may be exposed by removing the ohmic contact layer 130b exposed between the two electrodes, using the source electrode SE and the drain electrode DE as masks. The drain electrode DE may be formed to partially overlap the second electrode 170 to electrically contact with the second electrode 170. The drain electrode DE may electrically contact with the second electrode 170 such that the storage capacitor Cst can be charged with the pixel electrode supplied to the drain electrode DE through the source electrode SE.

The contact electrode CNT may be formed in a portion of the second electrode 170. The contact electrode CNT may be positioned to overlap the region exposed by the depressed pattern 152 of the second insulating layer and the domain forming layer 150.

Figure 5D:
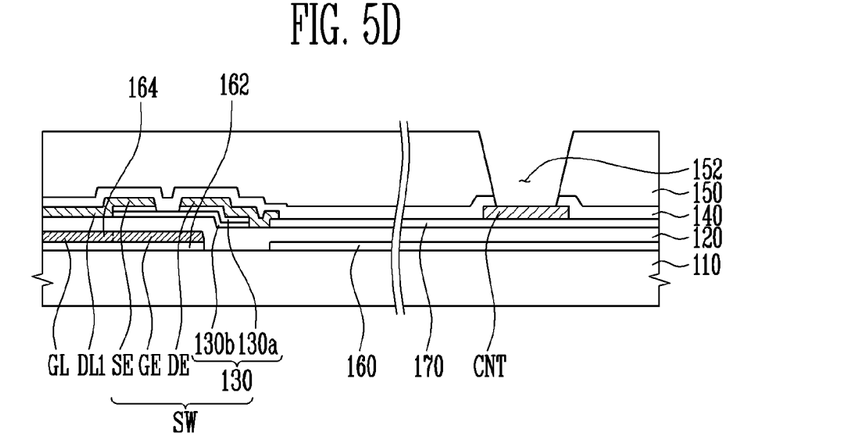

As shown in FIG. 5D, a second insulating layer 140 and the domain forming layer 150 may be formed to cover the source electrode SE, the drain electrode DE, and the second electrode 170. The second insulating layer 140 and the domain forming layer 150 may be formed by PECVD, spin coating, and spinless coating etc. The depressed pattern 152 may be formed by patterning the second insulating layer and the domain forming layer, using photolithography and etching. The depressed pattern 152 may be positioned in a region overlapping the contact electrode CNT.

The material of the second insulating layer 140 may be silicon oxide and silicon nitride, and the like. In some embodiments, the material included in the domain forming layer 150 may be an organic substance, such as positive type photoresist compound or negative type photoresist compound. In other embodiments, the material included in the domain forming layer 150 may be an inorganic substance, such as silicon oxide and silicon nitride.

Figure 5E:
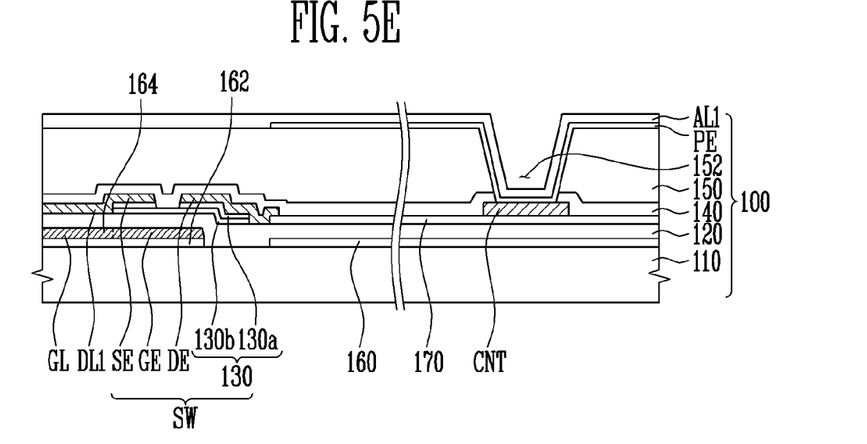

Referring to FIG. 5E, a transparent electrode layer (not shown) is formed on the domain forming layer 150 with the depressed pattern 152. A pixel electrode PE is formed by patterning the transparent electrode layer.

The pixel electrode PE may be electrically connected with the thin film transistor SW by contacting with the contact electrode CNT through the depressed pattern 152. In some embodiments, the material included in the transparent electrode layer may be ITO and IZO.

In some embodiments, a first alignment layer AL1 may be formed on the pixel electrode PE. In such embodiments, the first alignment layer AL1 may include a vertical alignment material that can vertically align liquid crystal molecules 310.

In some embodiments, such as the bottom gate structure shown in FIG. 5, the semiconductor layer may be implemented by a thin film transistor made of amorphous silicon. In other embodiments, such as a top gate structure, the semiconductor layer may be implemented by a thin film transistor made of polysilicon.

FIGS. 6A to 6F are cross-sectional views illustrating another embodiment of a manufacturing process of a portion of the embodiment of a liquid crystal display device shown in FIGS. 2 and 3.

For the convenience of description, a pixel region defined by a gate line and data line is limitedly described. The pixel region is divided into a thin film transistor region and a transmissive region.

Figure 6A:
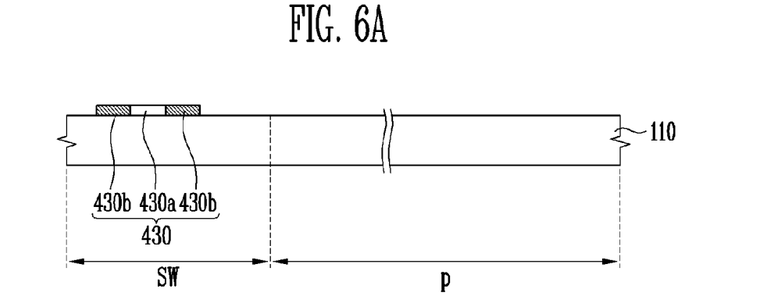
FIGS. 6A to 6F are cross-sectional views illustrating another embodiment of a manufacturing process of a portion of the embodiment of a liquid crystal display device shown in FIGS. 2 and 3.

Referring to FIG. 6A, a semiconductor layer 430 made of polysilicon (Poly-si) may be formed on the thin film transistor region above a substrate. In the semiconductor layer 430 made of polysilicon, an amorphous silicon layer is deposited and may be crystallized into a polysilicon layer by performing crystallization, such as ELA (Excimer Laser Annealing) using excimer laser, SLS (Sequential lateral Solidification) crystallization or heat treatment, or MILC (metal induced lateral crystallization). The semiconductor layer 430 may have an active region 430a including pure center polysilicon and source/drain regions 430b doped at both sides of the active region.

Figure 6B:
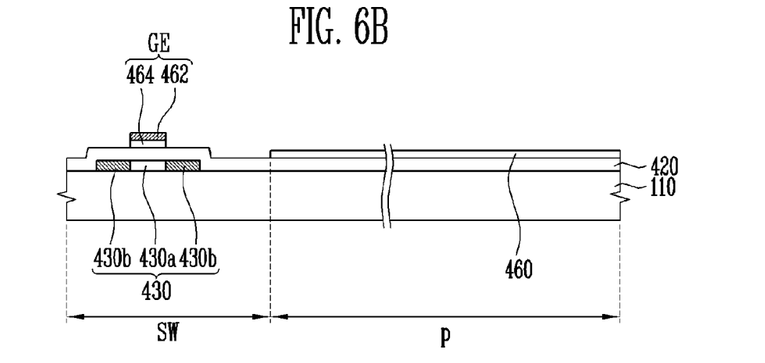

Referring to FIG. 6B, a first insulating layer 420 may be formed throughout the substrate 110 with the semiconductor layer 430. A gate electrode GE and a first electrode 160 of a storage capacitor may be formed in a region overlapping the semiconductor layer 430 and the transmissive region P, respectively.

This process is implemented by depositing a transparent conductive material and a low-resistance metal and patterning them. As described in reference to FIG. 5A, it is possible to simultaneously form the gate electrode and the first electrode by using the halftone mask process without adding a mask.

When the halftone mask process is used, the gate electrode, may have a structure in which a transparent conductive material 462 and the low-resistance metal 464 are stacked.

The thickness of the photoresistor PR disposed in the region where the first electrode is formed is made to be smaller than the thickness of the photoresistor disposed in the region where the gate electrode is formed. Consequently, by performing the photo process, the gate electrode GE has a structure in which the transparent material 462 and the low-resistance metal 464 are stacked, but the first electrode 460 is implemented by only the transparent conductive material, because the low-resistance material on the first electrode 460 is completely removed. Therefore, it is possible to simultaneously form the electrode GE and the first electrode 460 without adding an additional mask process.

In some embodiments, the transparent conductive material may include ITO (indium tin oxide), TO (tin oxide), IZO (indium zinc oxide), and ITZO (indium tin zinc oxide). These materials may be used alone or in combination.

In some embodiments, the low-resistance metal may be Mo, Al, AlNd, and Ti and the like, which may be used alone or in combination, in a simple structure or in a stacked structure.

Figure 6C:
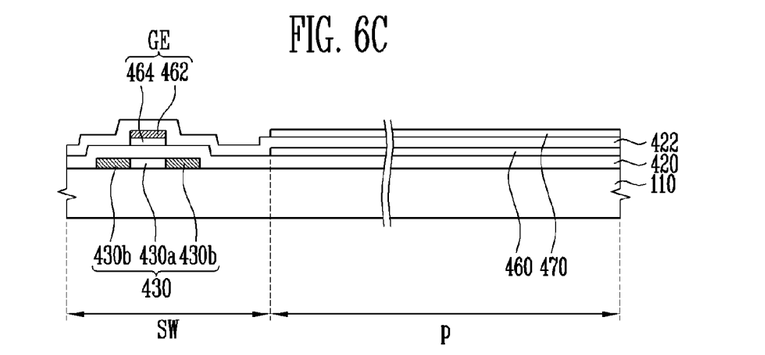

As shown in FIG. 6C, a second insulating layer 422 is formed on the substrate including the gate electrode GE and the first electrode 460 and a second electrode 470 of a storage capacitor is formed in a region overlapping the first electrode 460 on the second insulating layer.

In some embodiments, the second electrode 470 may be made of a transparent conductive material.

Figure 6D:
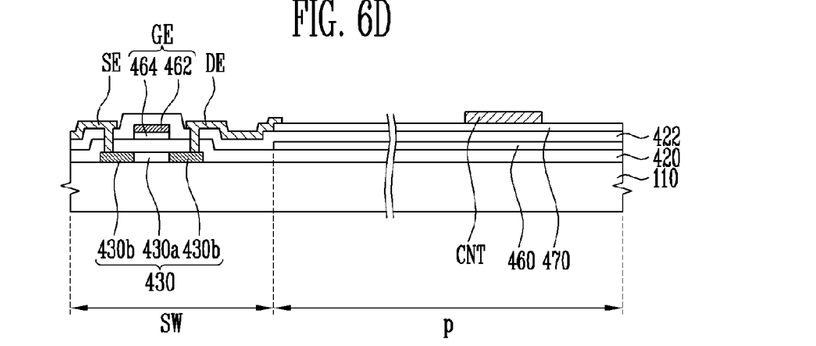

A source electrode SE, a drain electrode DE, and a contact electrode CNT may be formed, as shown in FIG. 6D. The source electrode SE, drain electrode DE, and contact electrode CNT may be formed by deposition, such as sputtering. The electrodes may be formed by being deposited with metal (e.g. Mo or MoW) and then patterned by photolithography or etching.

The source electrode SW and the drain electrode DE are electrically connected with the source/drain region 430b of the semiconductor layer 430, respectively, which may be implemented by forming a contact hole in the second insulating layer 422 having the source region and the drain region.

The drain electrode DE may be formed to partially overlap the second electrode 470 to electrically contact with the second electrode 470 and the storage capacitor Cst can be charged with the pixel electrode supplied to the drain electrode DE through the source electrode SE.

The contact electrode CNT may be formed in a portion of the second electrode 470. The contact electrode CNT may be positioned to overlap the region exposed by the depressed pattern 452 of the third insulating layer 440 and the domain forming layer 450.

Figure 6E:
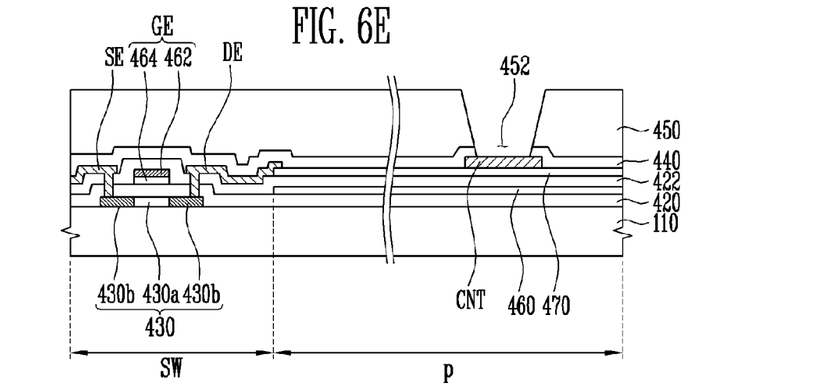

As shown in FIG. 6E, the second insulating layer 440 and the domain forming layer 450 may be formed to cover the source electrode, the drain electrode, and the second electrode 470. The third insulating layer 440 and the domain forming layer 450 may be formed by PECVD, spin coating, and spinless coating etc. The depressed pattern 452 may be formed by patterning the third insulating layer 440 and the domain forming layer 450, using photolithography and etching. The depressed pattern 452 may be positioned in a region overlapping the contact electrode CNT.

The material of the third insulating layer 440 may be silicon oxide and silicon nitride etc. The material of the domain forming layer 450 may be an organic substance, such as positive type photoresist compound or negative type photoresist compound, or an inorganic substance, such as silicon oxide and silicon nitride.

Figure 6F:
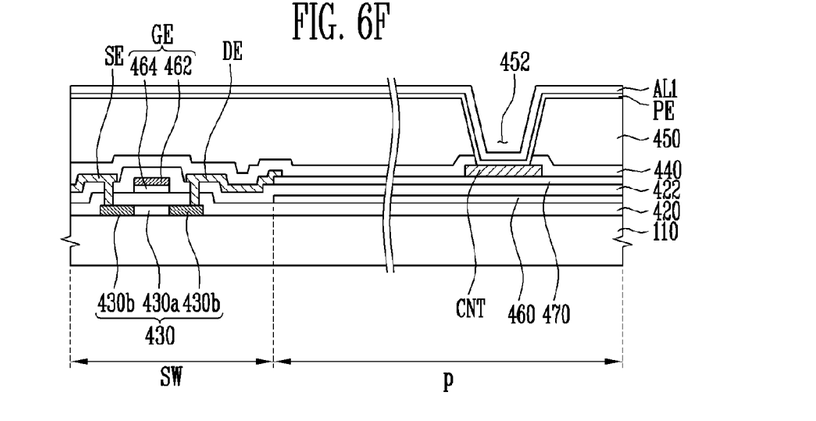

As shown in FIG. 6F, a transparent electrode layer (not shown) is formed on the domain forming layer 450 with the depressed pattern 452 and a pixel electrode PE is formed by patterning the transparent electrode layer. The pixel electrode PE may be electrically connected with the thin film transistor SW by contacting with the contact electrode CNT through the depressed pattern 452. In some embodiments, the material of the transparent electrode layer may be ITO and IZO.

A first alignment layer AL1 is formed on the pixel electrode PE, in which the first alignment layer AL1 may include a vertical alignment material that can vertically align liquid crystal molecules 310.

While certain embodiments of the present invention have been described, it is to be understood that the invention is not limited to the disclosed embodiments, but, on the contrary, is intended to cover various modifications and equivalent arrangements included within the spirit and scope of the invention.

What is claimed is:

1. A liquid crystal display device, comprising:
   a first substrate;
   a thin film transistor formed on the first substrate and disposed in a first, non-transmissive region, the thin film transistor comprising a gate electrode, a source electrode and a drain electrode;
   a storage capacitor comprising a first electrode and a second electrode formed in a second, transmissive region on the first substrate, wherein the first electrode and the second electrode of the storage capacitor are made of a transparent conductive material; and
   a pixel electrode formed on the second, transmissive region, overlapping the first and second electrodes of the storage capacitor,
   wherein the whole of the pixel electrode overlaps with both the first and second electrodes, and
   wherein at least one of the first electrode and the second electrode extends to the outside of the transmissive region.

2. The liquid crystal display device as claimed in claim 1, wherein a domain forming layer having a depressed pattern for forming a liquid crystal domain is formed between the pixel exectrode and the second electrode of the storage capacitor.

3. The liquid crystal display device as claimed in claim 1, further comprising: a second substrate comprising a common electrode formed throughout the surface facing the first substrate; and
   a liquid crystal layer, comprising a reactive mesogen, wherein the reactive mesogen is disposed between the first substrate and the second substrate and aligns liquid crystal molecules forming the liquid crystal domain.

4. The liquid crystal display device as claimed in claim 1, wherein the source electrode and the drain electrode are spaced apart from the gate electrode by an insulating layer.

5. The liquid crystal display device as claimed in claim 4, wherein the gate electrode is formed on the same layer as the first electrode, and comprises a transparent conductive material and a low-resistance metal, stacked together.

6. The liquid crystal display device as claimed in claim 4, wherein the drain electrode is formed to overlap a portion of the second electrode and is electrically connected to the second electrode and the drain electrode.

7. The liquid crystal display device as claimed in claim 2, wherein a contact electrode is further formed on the second electrode exposed by the depressed pattern, and comprises the same material as the source electrode and the drain electrode of the thin film transistor.

8. The liquid crystal display device as claimed in claim 1, wherein the transparent conductive material comprises at least one of indium tin oxide, tin oxide, indium zinc oxide, and indium tin zinc oxide.

9. A liquid crystal display device, comprising:
   a first substrate comprising:
      a thin film transistor disposed in a non-transmissive region;
      a storage capacitor comprising a transparent first electrode, a dielectric film, and a transparent second electrode which are sequentially formed, wherein the transparent first electrode and the transparent second electrode are formed in a transmissive region and wherein at least one of the first electrode and the second electrode extends to the outside of the transmissive region; and
      a pixel electrode formed on the transmissive region, wherein the whole of the pixel electrode overlaps with both the first and second electrodes;
   a second substrate facing the first substrate and having a common electrode; and
   a liquid crystal layer disposed between the first substrate and the second substrate,
   wherein the pixel electrode overlaps the common electrode.

10. The liquid crystal display device as claimed in claim 9, wherein the pixel electrode includes a transparent conductive material and forms capacitance with the storage capacitor by overlapping at least one of the first electrode and the second electrode.

11. The liquid crystal display device as claimed in claim 9, further comprising a backlight disposed under the first substrate, wherein transmittance of light emitted from the backlight unit and passing through the first substrate, the liquid crystal layer, and the second substrate within the transmissive region is 80% to 99.5%.

12. The liquid crystal display device as claimed in 9, wherein the dielectric film comprises at least one of silicon nitride and silicon oxide.

13. The liquid crystal display device as claimed in claim 12, wherein the thickness of the first electrode is between about 150 Å and about 1500 Å, the thickness of the insulating layer is between about 400 Å and 6000 Å, and the thickness of the second electrode is between about 150 Å and about 1500 Å.

* * * * *